(12) United States Patent
Toyohisa et al.

(10) Patent No.: US 11,686,441 B2
(45) Date of Patent: Jun. 27, 2023

(54) ILLUMINATION SYSTEM

(71) Applicants: KILT PLANNING OFFICE INC., Kawasaki (JP); KANEKA CORPORATION, Osaka (JP)

(72) Inventors: Shozo Toyohisa, Kawasaki (JP); Youichi Yamaguchi, Osaka (JP)

(73) Assignees: KILT PLANNING OFFICE INC., Kawasaki (JP); KANEKA CORPORATION, Osaka (JP)

( * ) Notice: Subject to any disclaimer, the term of this patent is extended or adjusted under 35 U.S.C. 154(b) by 0 days.

(21) Appl. No.: 17/761,509

(22) PCT Filed: Oct. 1, 2020

(86) PCT No.: PCT/JP2020/037428
§ 371 (c)(1),
(2) Date: Mar. 17, 2022

(87) PCT Pub. No.: WO2021/075273
PCT Pub. Date: Apr. 22, 2021

(65) Prior Publication Data
US 2022/0373145 A1 Nov. 24, 2022

(30) Foreign Application Priority Data

Oct. 18, 2019 (JP) ................................. 2019-190982

(51) Int. Cl.
*F21S 4/28* (2016.01)
*F21S 8/04* (2006.01)

(52) U.S. Cl.
CPC .. *F21S 4/28* (2016.01); *F21S 8/04* (2013.01)

(58) Field of Classification Search
CPC ...... F21S 4/28; F21S 8/04; F21S 8/063; F21S 2/005; F21Y 2115/10; F21Y 2115/20; F21V 11/02; H05B 33/02; H10K 50/00
See application file for complete search history.

(56) References Cited

U.S. PATENT DOCUMENTS

| 10,359,163 B1* | 7/2019 | Hettwer ..................... F21S 4/28 |
| 10,663,650 B2* | 5/2020 | Wu .......................... F21V 15/01 |

(Continued)

FOREIGN PATENT DOCUMENTS

| JP | 2010009969 A | 1/2010 |
| JP | 2016192264 A | 11/2016 |

(Continued)

OTHER PUBLICATIONS

International Bureau of WIPO, International Preliminary Report on Patentability Issued in Application No. PCT/JP2020/037428, dated Apr. 19, 2022, WIPO, 4 pages.

*Primary Examiner* — Tsion Tumebo
(74) *Attorney, Agent, or Firm* — Alleman Hall Creasman & Tuttle LLP

(57) ABSTRACT

The present invention provides a lighting system that can produce a gradation of brightness and gives an unprecedented characteristic impression. The lighting system is provided on a mounting surface and includes a plurality of strip-shaped plates each extending in a strip shape and one or a plurality of planar light sources, in which the plurality of strip-shaped plates are each arranged side by side at an interval such that a main surface of the strip-shaped plate intersects the mounting surface, wherein arrangement space is provided in an area outwardly extending from the strip-shaped plates, the planar light source is disposed in the arrangement space and constitutes an lengthy emission surface, and a part of light emitted from the emission surface enters between the strip-shaped plates during lighting.

9 Claims, 8 Drawing Sheets

(56) References Cited

U.S. PATENT DOCUMENTS

| | | | |
|---|---|---|---|
| 11,085,600 B2* | 8/2021 | Casement | ............... E04B 9/067 |
| 2008/0266842 A1 | 10/2008 | Skidmore et al. | |
| 2009/0122575 A1 | 5/2009 | Omura et al. | |
| 2009/0323349 A1 | 12/2009 | Ochiai | |
| 2010/0110674 A1* | 5/2010 | Hysky | .................... E04B 9/366 |
| | | | 362/253 |
| 2012/0268966 A1* | 10/2012 | McCollum | ................ F21S 8/06 |
| | | | 977/902 |
| 2019/0203914 A1 | 7/2019 | Toyohisa et al. | |

FOREIGN PATENT DOCUMENTS

| | | |
|---|---|---|
| WO | 2007049823 A1 | 5/2007 |
| WO | 2018047430 A1 | 3/2018 |

* cited by examiner

ILLUMINATION SYSTEM

TECHNICAL FIELD

The present invention relates to a lighting system. In particular, the present invention relates to a lighting system using a planar light source such as an organic EL panel or an LED panel.

BACKGROUND ART

Conventionally, there exists a lighting system that illuminates an exhibit such as a painting or a scroll when it is displayed (Patent Document 1).

Patent Document 1 discloses a lighting system that uses an organic EL panel as a light source and can illuminate an exhibit with soft light close to natural light.

PRIOR ART DOCUMENT

Patent Document

Patent Document 1: JP 2016-192264 A

DISCLOSURE OF INVENTION

Technical Problem

However, the lighting system described in Patent Document 1 has a problem of being simple and uninteresting because it simply illuminates an exhibit such as a painting or a scroll when displaying the exhibit. Therefore, there is a demand for a lighting system that does not do any harm on an exhibit and gives an unprecedented characteristic impression.

Therefore, an object of the present invention is to provide a lighting system that can produce gradation of brightness and gives an unprecedented characteristic impression.

Solution to Problem

One aspect of the present invention for solving the problem described above is a lighting system provided on a mounting surface, including: a plurality of strip-shaped plates each extending in a strip shape; and one or a plurality of planar light sources, wherein the plurality of strip-shaped plates are each arranged side by side at an interval such that a main surface of each of the plurality of strip-shaped plates intersects the mounting surface, wherein arrangement space is provided in an outside of the plurality of strip-shaped plates, the outside being in an extending direction of the plurality of strip-shaped plates, wherein the one or the plurality of planar light sources are each disposed in the arrangement space and constitute an emission surface that is lengthy, and wherein a part of light emitted from the emission surface enters between the plurality of strip-shaped plates during lighting.

The "mounting surface" as used herein is a surface to which the lighting system is mounted, and specifically refers to one surface of a fixed structure such as a ceiling, a wall, or a floor or one surface of a movable structure such as a desk or a shelf.

According to this aspect, since a part of light radiated from the planar light source is blocked by the strip-shaped plate during lighting of the planar light source, the light spreads gently, and gradation of brightness is formed in the extending direction of the strip-shaped plate. Therefore, it is possible to realize creative lighting space that is unique and remarkable, and is not provided in the conventional lighting system.

A preferred aspect is that the planar light source is an organic EL panel including a light-emitting region that emits diffusion light.

According to this aspect, space can be illuminated with light closer to natural light.

A preferred aspect is that the strip-shaped plates are arranged side by side in an upright state with respect to the mounting surface, and the emission surface is parallel to the mounting surface.

According to this aspect, the light radiated from the planar light source is appropriately reflected by the strip-shaped plate, and the gradation can be produced in a wider range.

A preferred aspect is that the emission surface faces the mounting surface at an interval.

According to this aspect, since the emission surface is hidden by the planar light source itself when viewed from the user side, the emission surface is not excessively dazzling for the user.

A preferred aspect is that the mounting surface is a ceiling surface, the lighting system includes a standing wall surface that hangs down from the ceiling surface, and the arrangement space is provided between the standing wall surface and an end surface of the strip-shaped plate.

According to this aspect, illumination from the outside of the strip-shaped plate can be ensured and an impression like indirect lighting can be given.

A more preferred aspect is that the arrangement space is provided along the standing wall surface.

According to this aspect, illumination in a linear form along the standing wall surface can be ensured, and the standing wall surface can be emphasized.

A more preferred aspect is that the standing wall surface extends in a planar shape or a curved surface shape.

A more preferred aspect is that the lighting system includes a second light source separate from the planar light source, wherein the second light source irradiates a standing wall surface side with light during lighting.

According to this aspect, the standing wall surface can be further emphasized.

One aspect of the present invention is a lighting system mounted to a ceiling surface and disposed adjacent to a standing wall surface hanging down from the ceiling surface, the lighting system including: a plurality of strip-shaped plates each extending in a strip shape; and one or a plurality of planar light sources, wherein the plurality of strip-shaped plates are arranged side by side at an interval such that a main surface of each of the plurality of strip-shaped plates is upright with respect to the ceiling surface, wherein arrangement space is provided between the standing wall surface and an end surface of the strip-shaped plate, the end surface being in an extending direction of the strip-shaped plate, wherein the arrangement space extends along the standing wall surface, wherein the one or the plurality of planar light sources are each disposed in the arrangement space and constitute an emission surface that is lengthy, and wherein a part of light emitted from the emission surface enters between the plurality of strip-shaped plates during lighting.

According to this aspect, since a part of light radiated from the planar light source is blocked by the strip-shaped plate during lighting of the planar light source, the light spreads gently, and gradation of brightness is formed in the extending direction of the strip-shaped plate. Therefore, it is possible to realize creative lighting space that is unique and remarkable, and is not provided in the conventional lighting system.

Effect of Invention

According to the present invention, bright and dark portions in a gradation pattern can be produced, and a user or the like can be given an unprecedented characteristic impression.

BRIEF DESCRIPTION OF DRAWINGS

FIGS. 8A and 8B are explanatory views of a lighting system according to another embodiment of the present invention, wherein FIG. 8A is a perspective view of a main part, and FIG. 8B is a side view of the main part.

BEST MODE FOR CARRYING OUT THE INVENTION

Figure 3:
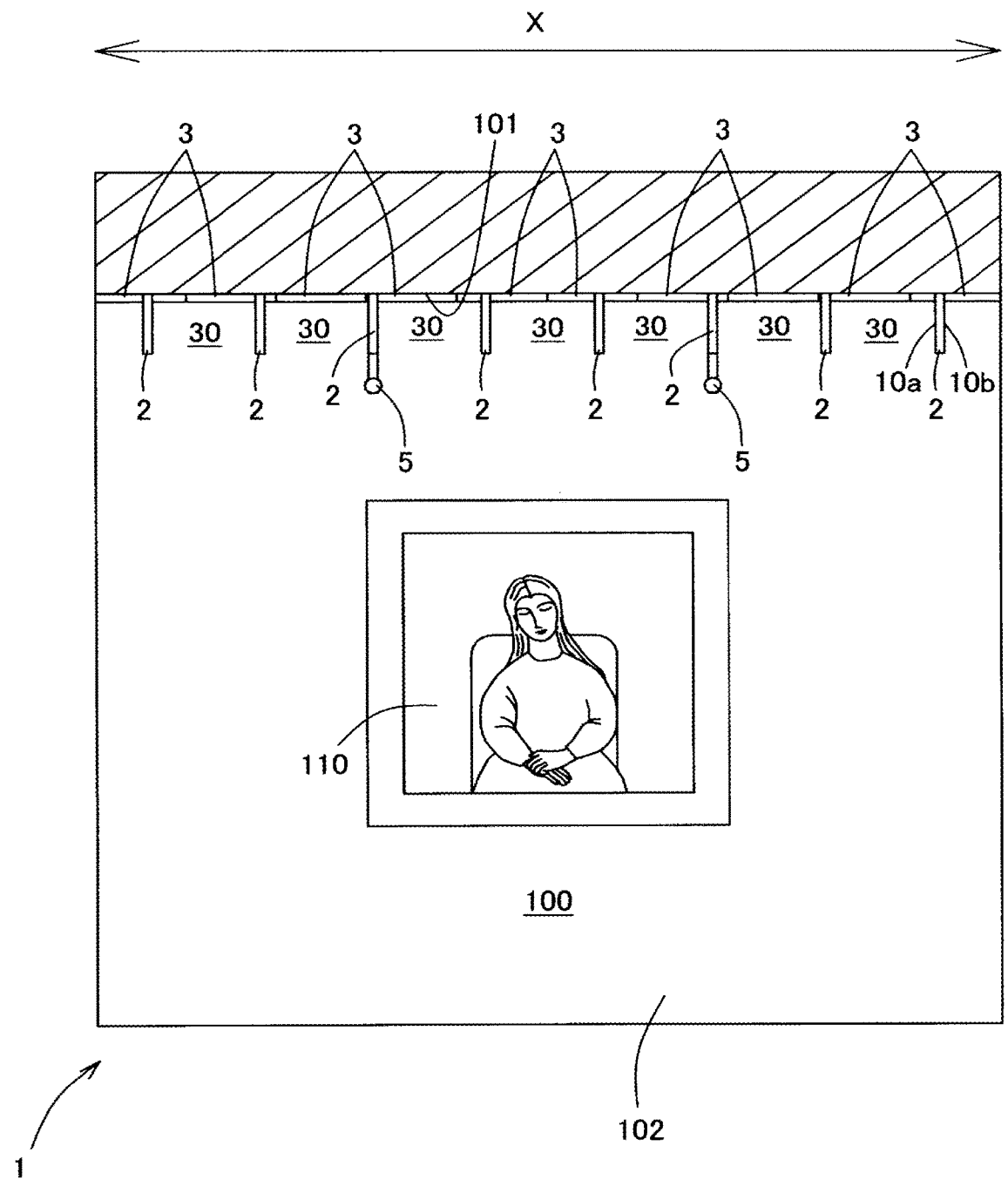
FIG. 3 is a front view of the lighting system of FIG. 1.

Hereinafter, embodiments of the present invention will be described in detail. Note that an attitude in which a standing wall surface 102 is taken as a front as in FIG. 3 is used as a reference in the following description.

Figure 1:
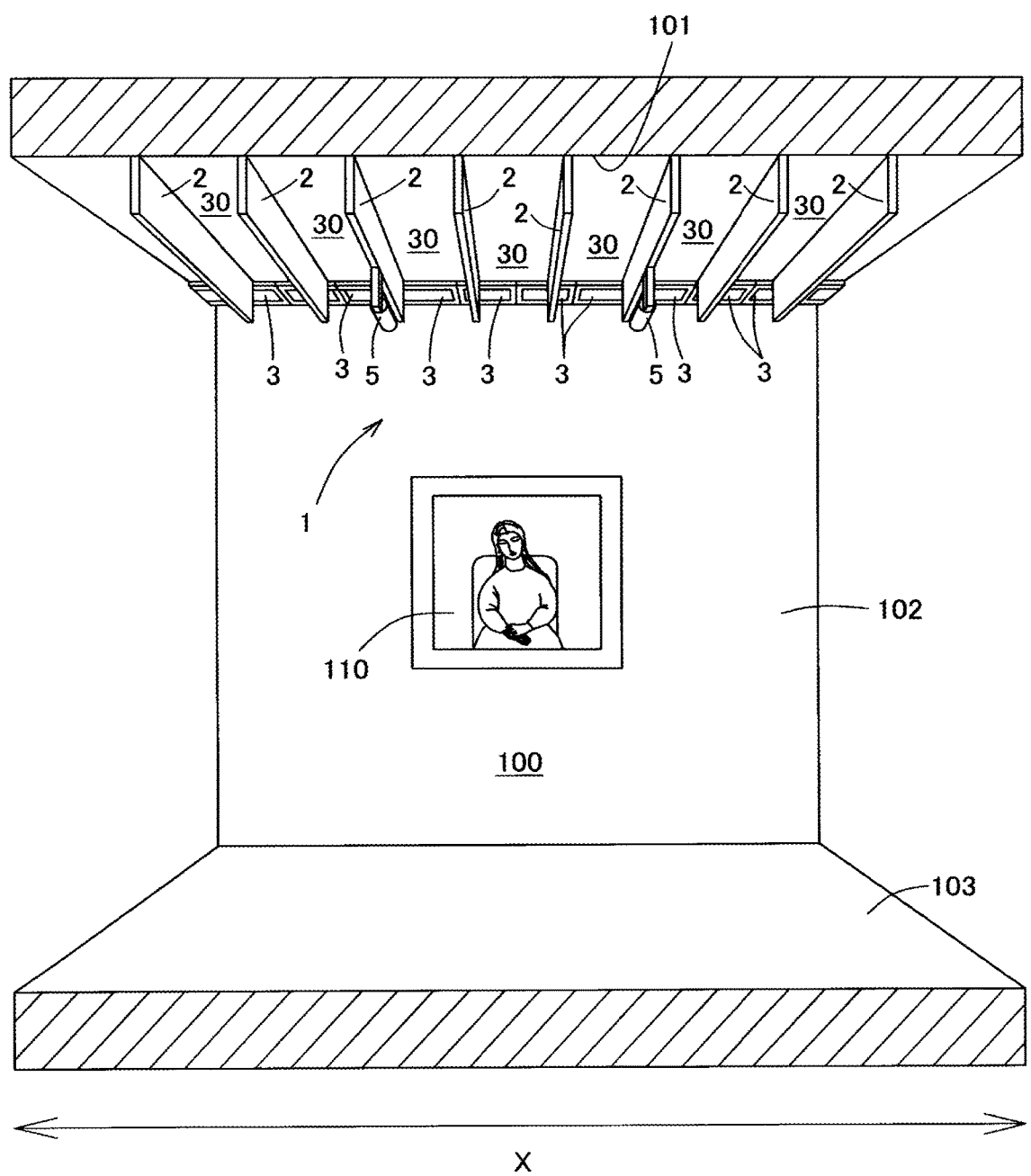
FIG. 1 is a perspective view schematically illustrating a lighting system according to a first embodiment of the present invention.

As illustrated in FIG. 1, a lighting system 1 according to a first embodiment of the present invention is provided in indoor space 100 to illuminate an exhibit 110 such as a painting or a scroll. In detail, a strip-shaped plate 2, a first light source 3, and a second light source 5 are provided on a ceiling surface 101 (mounting surface).

In the lighting system 1 of the present embodiment, the first light source 3 is used as a planar light source, and a part of light emitted from the first light source 3 during lighting is blocked by the strip-shaped plate 2, making it possible to form a lighting space having bright and dark portions in a gradation pattern, and bright and dark portions in a gradation pattern are generated on a floor surface 103.

Figure 2:
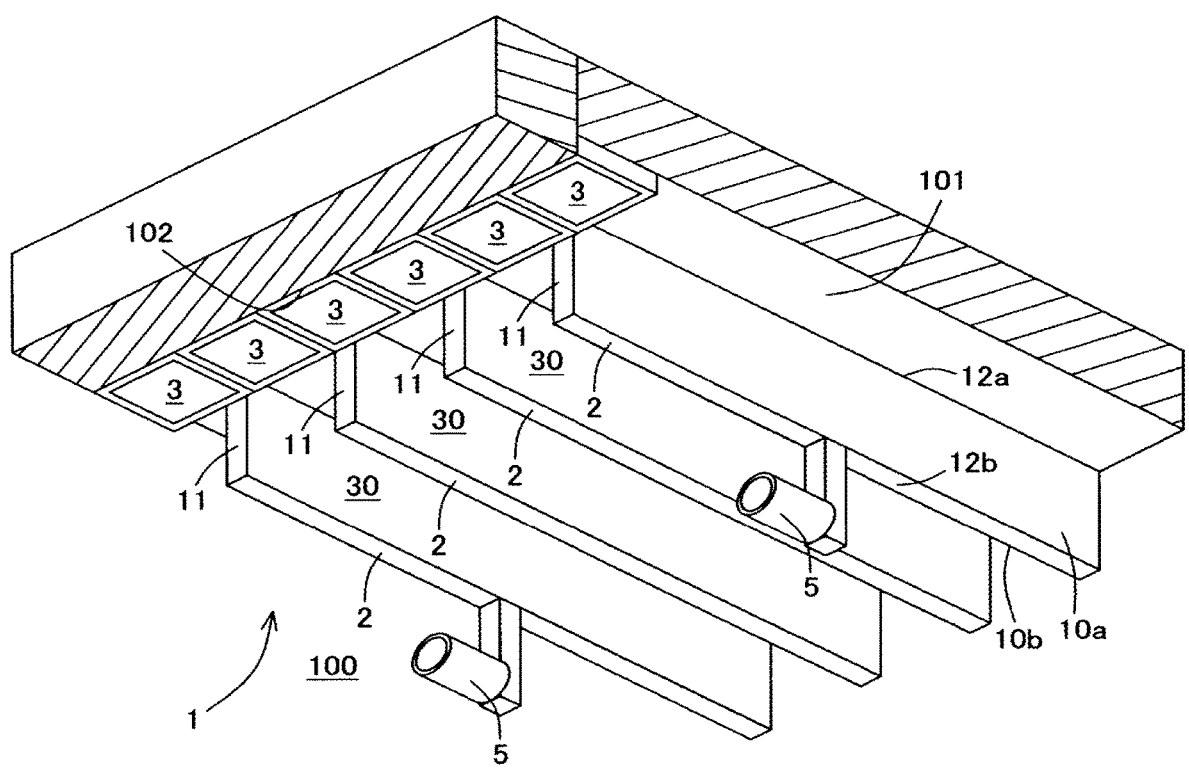
FIG. 2 is a perspective view of a main part of the lighting system of FIG. 1 as viewed from a standing wall surface side.

As illustrated in FIG. 2, the strip-shaped plate 2 is a long plate having a rectangular sectional shape and extending in a strip shape in a predetermined direction. Specifically, the strip-shaped plate 2 is a rectangular plate-like body, and as illustrated in FIGS. 2 to 5, the strip-shaped plate 2 is a flat plate including main surfaces 10a and 10b, a short end surface 11, and long end surfaces 12a and 12b.

Figure 4:
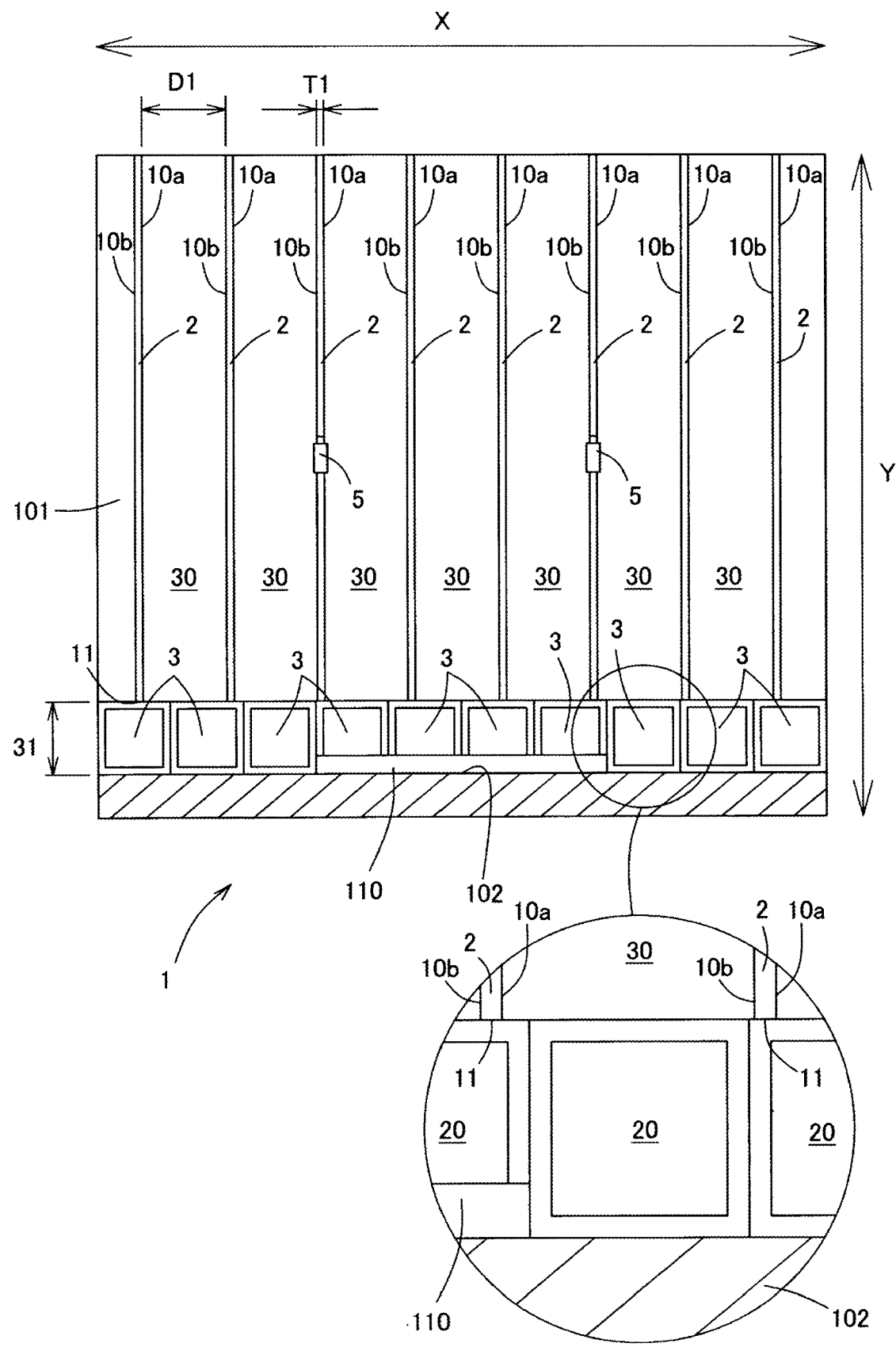
FIG. 4 is a bottom view of the lighting system of FIG. 1.

A thickness T1 of the strip-shaped plate 2 illustrated in FIG. 4 is preferably 3 mm or more and 6 cm or less.

Figure 5:
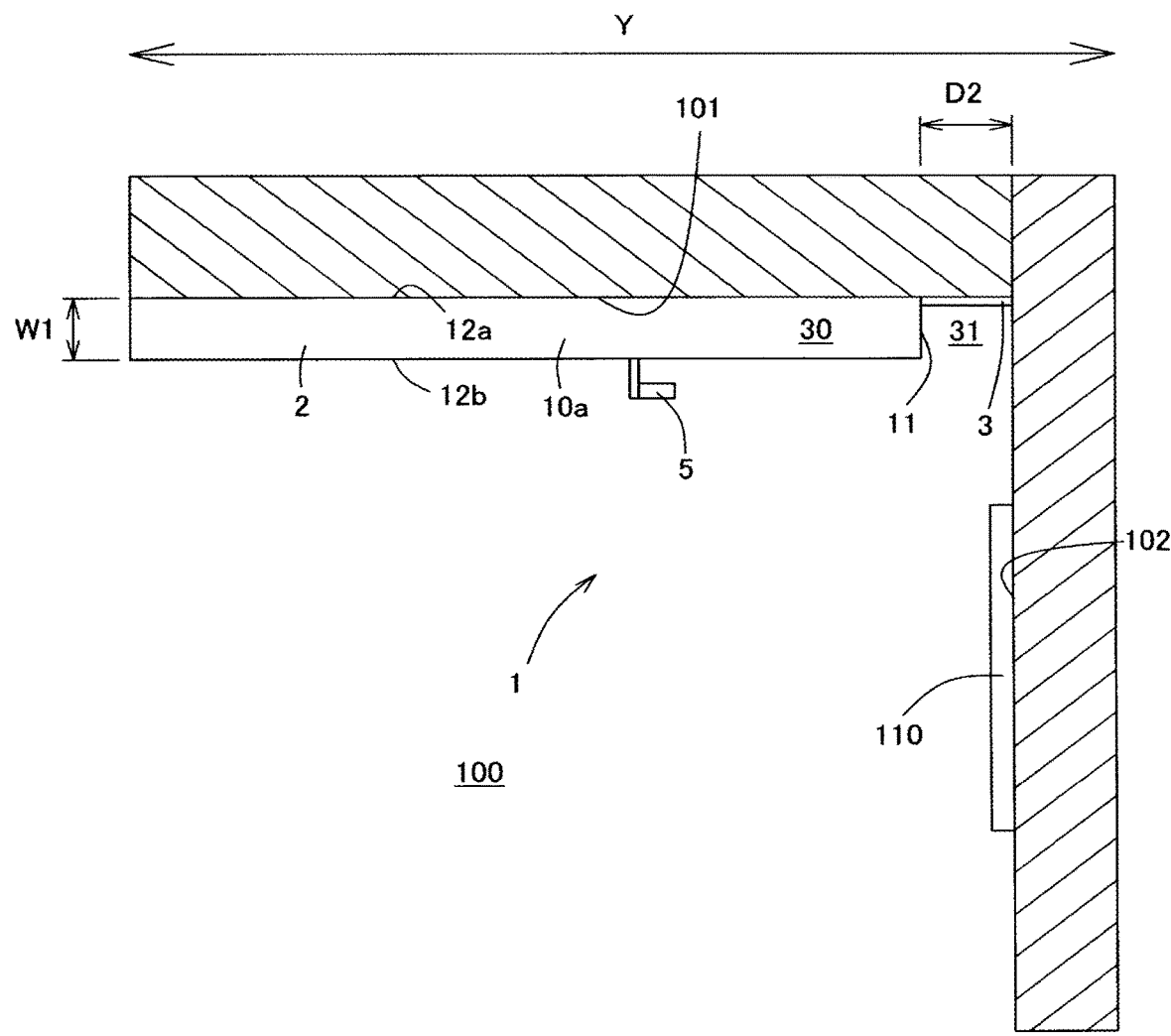
FIG. 5 is a longitudinal sectional view of the lighting system of FIG. 1.

A width W1 of the strip-shaped plate 2 illustrated in FIG. 5 is preferably 3 cm or more and 30 cm or less.

In these ranges, since the light emitted from the first light source 3 is sufficiently distributed around the strip-shaped plate 2, unevenness in brightness in a left-right direction X due to being blocked by the strip-shaped plate 2 hardly occurs, and although the strip-shaped plate 2 blocks a part of the light, substantially uniform gradation of brightness can be produced in a front-rear direction Y.

As illustrated in FIG. 4, the first light source 3 is a planar light source that has a light-emitting region 20 which planarly widens and emits planar diffusion light from the light-emitting region 20.

Specifically, the first light source 3 is an organic EL panel, has a thickness smaller than the width of the strip-shaped plate 2 as illustrated in FIG. 5, and can emit uniform diffusion light from the light-emitting region 20. That is, the first light source 3 includes an organic EL element corresponding to the light-emitting region 20.

Note that the first light source 3 may be an LED panel in which LEDs are planarly dispersed.

The second light source 5 is a spot light source that directly irradiates the standing wall surface 102 side.

The second light source 5 is a point light source, and specifically, is an LED. Note that the second light source 5 may be a planar light source such as an organic EL panel.

As illustrated in FIG. 1, the ceiling surface 101 constitutes the indoor space 100 together with the standing wall surface 102 and the floor surface 103. That is, the ceiling surface 101 faces the floor surface 103 with the indoor space 100 interposed therebetween.

The standing wall surface 102 is a wall surface connecting an edge of the ceiling surface 101 and an edge of the floor surface 103. The standing wall surface 102 is orthogonal to both the ceiling surface 101 and the floor surface 103, and extends in the vertical direction. Further, as illustrated in FIG. 4, the standing wall surface 102 extends linearly in the left-right direction X.

The exhibit 110 can be attached to the standing wall surface 102.

Next, a positional relationship of each member of the lighting system 1 of the first embodiment will be described. Note that a case where the exhibit 110 is provided on the standing wall surface 102 will be described in the following description.

As illustrated in FIG. 3, the strip-shaped plates 2 are each arranged side by side at a regular interval on the ceiling surface 101 in the left-right direction X, and are parallel to each other.

The width direction of each strip-shaped plate 2 extends in the intersecting direction (orthogonal direction in the present embodiment) with respect to the ceiling surface 101. That is, the main surfaces 10a and 10b forming the side surfaces of each strip-shaped plate 2 intersect the ceiling surface 101 and hang down from the ceiling surface 101.

In the adjacent strip-shaped plates 2 and 2, the main surfaces 10a and 10b face each other at an interval.

As illustrated in FIG. 4, the strip-shaped plate 2 extends so as to traverse most of the ceiling surface 101 in the front-rear direction Y, and extends in a range of 80% or more of the ceiling surface 101 in the extending direction of the strip-shaped plate 2.

As illustrated in FIG. 2, one long end surface 12a (upper end surface) which is an end surface in the width direction of each strip-shaped plate 2 is in surface contact with the ceiling surface 101.

In the specific strip-shaped plate 2, the second light source 5 is provided on the other long end surface 12b (lower end surface), and the second light source 5 can irradiate the standing wall surface 102 with light.

An interval D1 between the adjacent strip-shaped plates 2 and 2 illustrated in FIG. 4 is preferably 5 cm or more and 30 cm or less.

Light diffusion space 30 enclosed by the strip-shaped plates 2 adjacent to the ceiling surface 101 is formed between the adjacent strip-shaped plates 2 and 2.

The light diffusion space 30 is space extending along the strip-shaped plate 2, and is space in which light emitted from the first light source 3 is diffused when the first light source 3 is turned on.

As illustrated in FIG. 4, arrangement space 31 is formed in an area outwardly extending from the strip-shaped plates 2.

The arrangement space 31 is space provided outside the short end surface 11 which is an end surface in the extending direction of the strip-shaped plate 2, and is space between the standing wall surface 102 and the strip-shaped plates 2.

In the arrangement space 31, the first light source 3 is continuously arranged, and the arrangement space 31 is partially continuous with the light diffusion space 30.

A width D2 of the arrangement space 31 illustrated in FIG. 5 (a distance between the standing wall surface 102 and the short end surface 11) is preferably 5 cm or more and 40 cm or less.

The width D2 of the arrangement space 31 illustrated in FIG. 5 is preferably 1 time or more and 1.2 times or less comparing to a length of a side of the first light source 3.

As illustrated in FIG. 4, the first light sources 3 are arranged in a row in the arrangement space 31 in the left-right direction X, and constitute an emission surface that emits light in a lengthy manner along the standing wall surface 102 during lighting.

In each of the first light sources 3, the light-emitting region 20 faces downward, and the emission surfaces which are the lower surfaces of the plurality of first light sources 3 are parallel to the ceiling surface 101.

According to the lighting system 1 of the first embodiment, the strip-shaped plates 2 are arranged side by side and fixed to the ceiling surface 101 like a ceiling louver, and during lighting of the first light sources 3, a part of the light emitted from the first light sources 3 is blocked by the strip-shaped plates 2, so that the brightness gradually decreases and the light spreads gently, and smooth and characteristic gradation of brightness is produced in space between the floor surface 103 and the strip-shaped plate 2. Therefore, unique, remarkable, and unprecedented creative lighting space can be realized.

In addition, according to the lighting system 1 of the first embodiment, since the planar light source that emits planar diffusion light is used as the first light source 3, gradation is hardly generated on the standing wall surface 102, and the standing wall surface 102 can be almost uniformly illuminated with light. Therefore, even when the exhibit 110 is displayed on the standing wall surface 102, the gradation of brightness is less likely to interfere with the exhibit 110.

According to the lighting system 1 of the first embodiment, since the thickness of the first light source 3 is small with respect to the width of the strip-shaped plate 2, the first light source 3 is difficult to see, and it is possible to pretend that the ceiling surface 101 itself has a light source and emits light during lighting.

According to the lighting system 1 of the first embodiment, since the organic EL panel is used as the first light source 3, the temperature of the exhibit 110 hardly becomes high by the first light source 3, and the exhibit 110 can be displayed in light closer to natural light. Further, since the diffusion light uniform in the plane can be emitted from the light-emitting region 20 of the first light source 3, soft, smooth, and natural lighting space can be produced.

Figure 6:
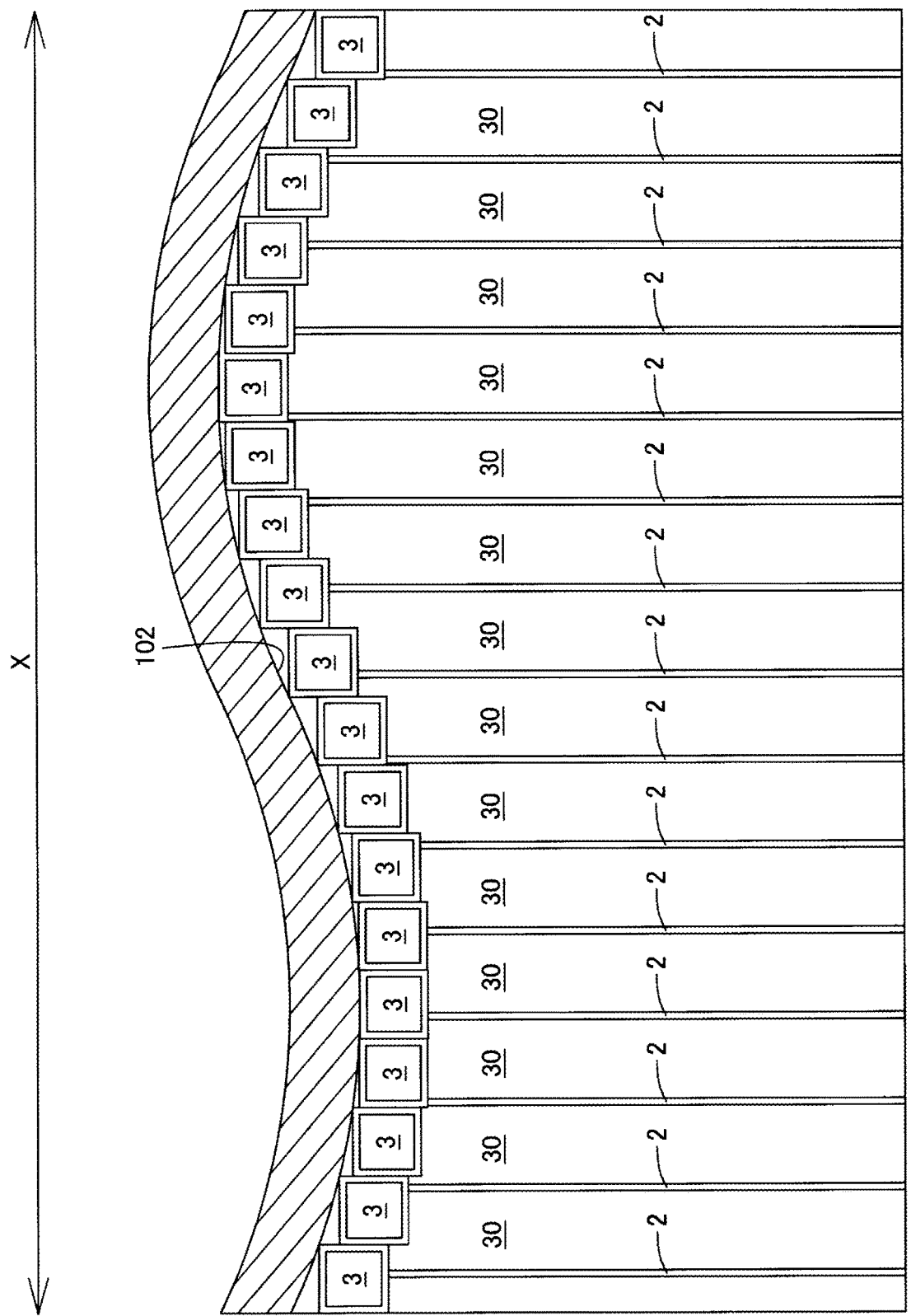
FIG. 6 is a bottom view of a main part of a lighting system according to another embodiment of the present invention.

In the above-described embodiment, the strip-shaped plate 2 and the like are provided on the standing wall surface 102 extending in a planar shape, but the present invention is not limited thereto. As illustrated in FIG. 6, the strip-shaped plate 2 or the like may be provided on the standing wall surface 102 that is bended and extends in a curved surface shape. That is, as illustrated in FIG. 6, the standing wall surface 102 may extend in a curved shape in the left-right direction X in plan view.

Figure 7:
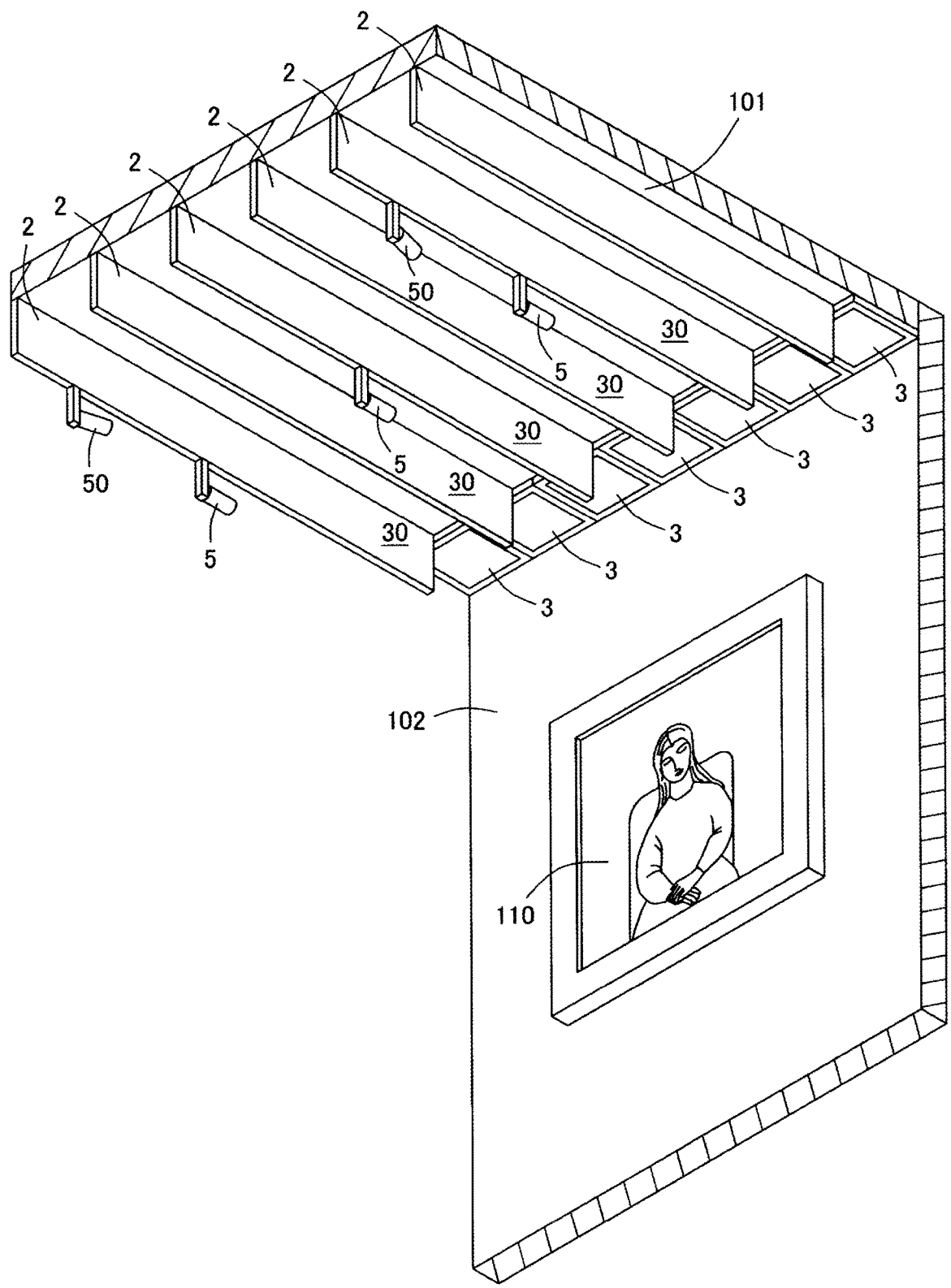
FIG. 7 is a perspective view of a main part of a lighting system according to another embodiment of the present invention.

In the above-described embodiment, the second light source 5 illuminates the standing wall surface 102 and indirectly illuminates the exhibit 110, but the present invention is not limited thereto. The second light source 5 may directly illuminate the exhibit 110. Further, as illustrated in FIG. 7, a third light source 50 that directly illuminates the exhibit 110 may be provided separately from the second light source 5.

Figure 8A:
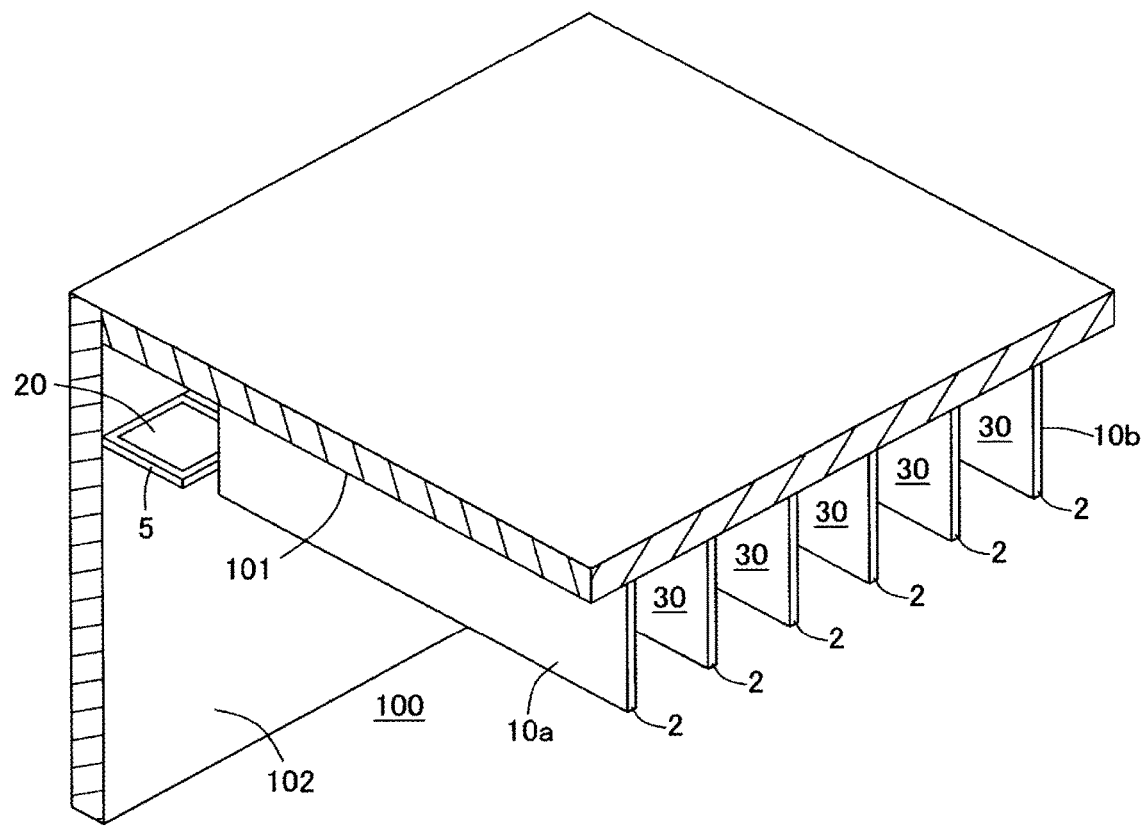
Figure 8B:
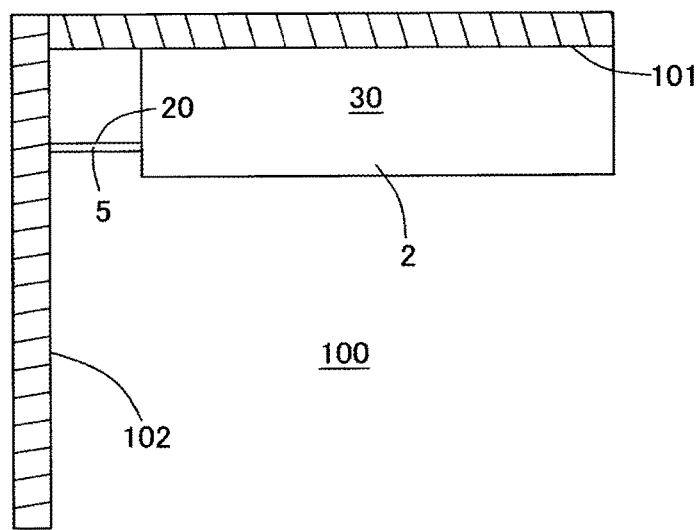

In the above-described embodiment, in the first light source 3, the light-emitting region 20 is directed to the opposite side of the ceiling surface 101, and the first light source 3 directly illuminates the exhibit 110 side, but the present invention is not limited thereto. As illustrated in FIGS. 8A and 8B, the first light source 3 may be provided such that the light-emitting region 20 faces the ceiling surface 101 at an interval, and the first light source 3 may be directed to the ceiling surface 101 to illuminate the exhibit 110 side with indirect light.

At this time, the interval between the light-emitting region 20 of the first light source 3 and the ceiling surface 101 is preferably narrower than the width W1 of the strip-shaped plate 2, and the first light source 3 is preferably at a position higher than the lower end of the strip-shaped plate 2.

In this way, it is possible to provide a situation where the light-emitting region 20 of the first light source 3 is hidden by the first light source 3 itself and is not visually recognized from the indoor space 100 side. Therefore, the light-emitting region 20 is not visually recognized by the user directly and is not excessively dazzling. In addition, the irradiation light of the first light source 3 leaks from between the strip-shaped plates 2, and unprecedented lighting space can be formed.

In the above-described embodiment, the plurality of first light sources 3 are arranged side by side to constitute the emission surface, but the present invention is not limited thereto. A lengthy first light source 3 may be used.

In the above-described embodiment, the strip-shaped plate 2 has the width direction extending in a direction orthogonal to the ceiling surface 101, but the present invention is not limited thereto. The strip-shaped plate 2 suffices to have the width direction extending in a direction in which the width direction intersects the ceiling surface 101. That is, the main surfaces 10*a* and 10*b* of the strip-shaped plate 2 may be inclined with respect to the ceiling surface 101.

In the above-described embodiment, the lighting system 1 is configured by providing the strip-shaped plate 2 and the like on the ceiling surface 101, but the present invention is not limited thereto. The lighting system 1 may be configured by providing the strip-shaped plate 2 or the like on the standing wall surface 102, or may be configured by providing the strip-shaped plate 2 or the like on the floor surface 103.

In the above-described embodiment, the case where the exhibit 110 is provided on the standing wall surface 102 has been described, but the present invention is not limited thereto. The exhibit 110 may be placed on the floor surface 103.

In the above-described embodiment, the strip-shaped plate 2 is a flat plate in which the main surfaces 10a and 10b extend in a planar shape, but the present invention is not limited thereto. The strip-shaped plate 2 may have the main surfaces 10a and 10b extending in a curved surface shape.

In the above-described embodiments, each of the constituent members can freely be replaced or added between each of the embodiments as long as it is within the technical scope of the present invention.

EXPLANATION OF REFERENCE CHARACTERS

1: Lighting system
2: Strip-shaped plate
3: First light source
5: Second light source
10a, 10b: Main surface
11: Short end surface
12a, 12b: Long end surface
20: Light-emitting region
30: Light diffusion space
31: Arrangement space
100: Indoor space
101: Ceiling surface (mounting surface)
102: Standing wall surface
103: Floor surface
110: Exhibit

The invention claimed is:

1. A lighting system provided on a mounting surface, comprising:
   a plurality of strip-shaped plates each extending in a strip shape; and
   one or a plurality of planar light sources,
   wherein the plurality of strip-shaped plates are each arranged side by side at an interval such that a main surface of each of the plurality of strip-shaped plates intersects the mounting surface,
   wherein arrangement space is provided in an outside of the plurality of strip-shaped plates, the outside being in an extending direction of the plurality of strip-shaped plates,
   wherein the one or the plurality of planar light sources are each disposed in the arrangement space and constitute an emission surface that is lengthy, and
   wherein a part of light emitted from the emission surface enters between the plurality of strip-shaped plates during lighting.

2. The lighting system according to claim 1, wherein the planar light source is an organic EL panel including a light-emitting region that emits diffusion light.

3. The lighting system according to claim 1,
   wherein the strip-shaped plates are arranged side by side in an upright state with respect to the mounting surface, and
   wherein the emission surface is parallel to the mounting surface.

4. The lighting system according to claim 1, wherein the emission surface faces the mounting surface at an interval.

5. The lighting system according to claim 1,
   wherein the mounting surface is a ceiling surface,
   wherein the lighting system includes a standing wall surface that hangs down from the ceiling surface, and
   wherein the arrangement space is provided between the standing wall surface and an end surface of the strip-shaped plate.

6. The lighting system according to claim 5, wherein the arrangement space is provided along the standing wall surface.

7. The lighting system according to claim 5, wherein the standing wall surface extends in a planar shape or a curved surface shape.

8. The lighting system according to claim 5, further comprising a second light source separate from the planar light source,
   wherein the second light source irradiates a standing wall surface side with light during lighting.

9. A lighting system mounted to a ceiling surface and disposed adjacent to a standing wall surface hanging down from the ceiling surface, the lighting system comprising:
   a plurality of strip-shaped plates each extending in a strip shape; and
   one or a plurality of planar light sources,
   wherein the plurality of strip-shaped plates are arranged side by side at an interval such that a main surface of each of the plurality of strip-shaped plates is upright with respect to the ceiling surface,
   wherein arrangement space is provided between the standing wall surface and an end surface of the strip-shaped plate, the end surface being in an extending direction of the strip-shaped plate,
   wherein the arrangement space extends along the standing wall surface,
   wherein the one or the plurality of planar light sources are each disposed in the arrangement space and constitute an emission surface that is lengthy, and
   wherein a part of light emitted from the emission surface enters between the strip-shaped plates during lighting.

* * * * *